US009941885B2

(12) United States Patent
Singh

(10) Patent No.: US 9,941,885 B2
(45) Date of Patent: Apr. 10, 2018

(54) LOW POWER GENERAL PURPOSE INPUT/OUTPUT LEVEL SHIFTING DRIVER

(71) Applicant: STMicroelectronics International N.V., Amsterdam (NL)

(72) Inventor: Prashant Singh, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/257,693

(22) Filed: Sep. 6, 2016

(65) Prior Publication Data

US 2018/0069552 A1    Mar. 8, 2018

(51) Int. Cl.
| | |
|---|---|
| H03L 5/00 | (2006.01) |
| H03K 19/0185 | (2006.01) |
| H03K 3/356 | (2006.01) |
| H03K 19/00 | (2006.01) |

(52) U.S. Cl.
CPC ............ H03K 19/018521 (2013.01); H03K 3/356104 (2013.01); H03K 19/0013 (2013.01)

(58) Field of Classification Search
CPC ............................................. H03K 19/018521
See application file for complete search history.

(56) References Cited

U.S. PATENT DOCUMENTS

2011/0025380 A1*  2/2011  Kim .................. H03K 19/01852
                                                    327/108

OTHER PUBLICATIONS

Annema, A.J, et al. "5.5-V I/O in a 2.5-V 0.25-μm CMOS Technology," IEEE J. Solid-State Circuits, Mar. 2001 vol. 36, No. 3, pp. 528-538.
Bae J. et al. "Statistical Models for Hot Electron Degradation in Nano-Scaled MOSFET Devices," et al. IEEE Trans. Reliability, Sep. 2007 vol. 56, No. 3, pp. 392-400.
Chen, S.L et al. "An output buffer for 3.3-V application in a 0.13-um 1/2.5-V CMOS process" et al IEEE Trans. Circuits Syst. II, Express Briefs, Jan. 2007 vol. 54, No. 1, pp. 14-18.
Ker et al, et al, "Overview and design of mixed voltage I/O with low-voltage thin-oxide CMOS transistors," IEEE Trans. Circuits and Systems I Sep. 2006, vol. 53, No. 9, pp. 1934-1945.
Kufluoglu H. et al. "Theory of Interface-Trap-Induced NBTI Degradation for Reduced Cross Section MOSFETs," et al. IEEE Trans. Electron Devices, May 2006, vol. 53, No. 5, pp. 1120-1130.

(Continued)

Primary Examiner — Daniel Puentes
(74) Attorney, Agent, or Firm — Gardere Wynne Sewell LLP

(57) ABSTRACT

Disclosed herein is an low power output stage coupled between a supply node and a ground node, configured to drive an output, and controlled by first, second, and third control nodes. A current sinking circuit controlled by an input signal and configured to sink current from the first and second control nodes when the input signal transitions to a first logic level, thereby resulting in decoupling of the output stage from the ground node and sourcing of current to the output by the output stage. When the input signal transitions to a second logic level different than the first logic level, the current sinking circuit sinks current from a third control node, thereby resulting in decoupling of the output stage from the supply node and sinking of current from the output by the output stage.

23 Claims, 3 Drawing Sheets

(56) References Cited

OTHER PUBLICATIONS

Lee T.J. et al. "1.8 V to 5.0 V mixed-voltage tolerant I/O buffer with 54.59% output duty cycle, et al" IEEE International Symposium on VLSI Design, Automation and Test, 2008, pp. 93-96.
Lee T.J. et al, "Wide-range 5.0/3.3/1.8 V I/O buffer using 0.35 μm 3.3-V CMOS technology, et al." IEEE Trans. Circuits Syst. I, Reg. Papers, Apr. 2009, vol. 36, No. 4, pp. 763-772.
Monga S. et al. "A 73μW 400Mbps stress tolerant 1.8V-3.6V driver in 40nm CMOS," in Proceedings of the ESSCIRC, 2011, pp. 187-190.
Rohner J.M. et al. "Voltage Acceleration of TBD and Its Correlation to Post Breakdown Conductivity of N- and PChannel MOSFETs," Proc. IEEE Int. Reliab. Phys. Symp.2006, pp. 76-81.
Wang C.C et al "A 1/2 X VDD to 3 X VDD bidirectional I/O buffer with a dynamic gate bias generator," IEEE Trans. Circuits Syst. I, Regular Papers,Jul. 2010, pp. 1642-1653, vol. 57, No. 71.

* cited by examiner

LOW POWER GENERAL PURPOSE INPUT/OUTPUT LEVEL SHIFTING DRIVER

TECHNICAL FIELD

This disclosure is related to the field of data communications, and more particularly, to a level shifting driver for input/output ports.

BACKGROUND

The Internet of Things (IOT) is a term used to describe networks of numerous devices, other than the commonly connected computers, laptops, smartphones, and tablets, communicating over the Internet. Some projections are that there will be billions of such devices connected over the Internet in the near future.

Some building blocks used in IOT devices include ultra-low power microcontrollers and systems on chips (SoCs). In order to exchange data within such devices, digital general purpose input output (GPIO) connections are used. Since a design challenge in IOT devices is the desire for ultra low power consumption at a low component cost, it is highly desirable to reduce power consumed by GPIO connections. GPIOs can operate in an active node and in a standby mode, and it is desirable to reduce leakage current in both modes. For example, it is desirable for leakage currents to be less than 1 microampere in active mode, and less than 20 nanoamperes in standby mode.

Current GPIOs for used in IOT devices may still have undesirably high leakage currents, and thus greater power consumption than desirable. This is particularly of concern in IOT applications powered by batteries, for example. Thus, further development in the area of GPIO circuitry is desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an output stage coupled between a supply node and a ground node, and configured to drive an output. A current sinking circuit is controlled by an input signal and configured to sink current from first and second control nodes when the input signal transitions to a first logic level, thereby resulting in decoupling of the output stage from the ground node and sourcing of current to the output by the output stage. When the input signal transitions to a second logic level different than the first logic level, the current sinking circuit sinks current from a third control node, thereby resulting in decoupling of the output stage from the supply node and sinking of current from the output by the output stage.

The output stage may include a pull-up circuit, which itself may include a first PMOS transistor having a source coupled to the supply node, a drain to be coupled to the output, and a gate coupled to the first control node, and a second PMOS transistor having a source coupled to the supply node, a drain to be coupled to the output, and a gate coupled to the first control node. Sinking of current from the first control node turns on the first and second PMOS transistors, thereby causing sourcing of current to the output by the first and second PMOS transistors.

The current sinking circuit may include a first NMOS transistor having a drain coupled to the second control node, a source coupled to the ground node, and a gate controlled by the input signal, and a second NMOS transistor having a drain to be coupled to the output, a source coupled to the ground node, and a gate controlled by a complement of the input signal. The input signal being at the first logic level may result in turning on of the first NMOS transistor and sinking of current from the first control node. The input signal being at the second logic level may result in turning on of the second NMOS transistor and sinking of current from the output by the second NMOS transistor.

The output stage may also include a third NMOS transistor having a drain to be coupled to the output, a source coupled to the ground node, and a gate coupled to the second control node. Turning on of the first NMOS transistor may also result in sinking of current from the second control node resulting in turning off of the third NMOS transistor and decoupling of the output from the ground node. The input signal being at the first logic level may result in turning off of the second NMOS transistor and further decoupling of the output from the ground node. The turning one of the first NMOS transistor may cause sinking of current from the second control node by the first NMOS transistor. The sinking of current from the second control node may thereby turning off of the first NMOS transistor and the turning on of the third NOMS transistor to sink current from output.

The current sinking circuit may include a fifth NMOS transistor having a source coupled to the ground node, a drain, and a gate controlled by the input signal. A third PMOS transistor may have a source coupled to the supply node, a drain coupled to the third control node, and a gate coupled to the first control node. A fourth PMOS transistor may have a source coupled to the supply node, a drain coupled to the third control node, and a gate coupled to the third control node. A fifth PMOS transistor may have a source coupled to the supply node, a drain coupled to the first control node, and a gate coupled to the third control node. The input signal may be at the second logic level results in turning on of the fifth NMOS transistor, in turn causing sinking of current from the third control node, which in turn causes turn on of the fifth PMOS transistor. The turning on of the fifth PMOS transistor may result in sourcing of current to the first control node, thereby causing turnoff of the first and second PMOS transistors, in turn causing decoupling of the output from the supply node.

The output stage may include a fourth NMOS transistor having a drain to be coupled to the output, a source coupled to the drain of the third NMOS transistor, and a gate coupled to a first enable node.

An enable circuit may include a first enable NMOS transistor having a source coupled to the ground node, a drain coupled to the first enable node, and a gate coupled to a first enable signal. A second enable NMOS transistor has a source coupled to the first enable node, a drain, and a gate coupled to a reference node. A first enable PMOS transistor has a drain coupled to the drain of the second enable NMOS transistor, a source coupled to a second enable node, and a gate coupled to the reference node. A second enable PMOS transistor has a drain coupled to the second enable node, a source coupled to the source node, and a gate coupled to the first control node. A third enable PMOS transistor has a source coupled to the supply node, a drain coupled to the first control node, and a gate coupled to the second enable node. The first enable signal may be at a second logic level results in turning off of the first enable NMOS transistor, thereby causing sourcing of current to the first enable node by the second enable NMOS transistor, first enable PMOS transistor, and second enable PMOS transistor. The sourcing of current to the first enable node may result in turning on of the fourth NMOS transistor. The first enable signal being at a first logic level may result in turning on of the first enable NMOS transistor, thereby causing sinking of current from the first enable node by the first enable NMOS transistor. The sinking of current from the first enable node may result in turning off of the fourth transistor.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Figure 1:
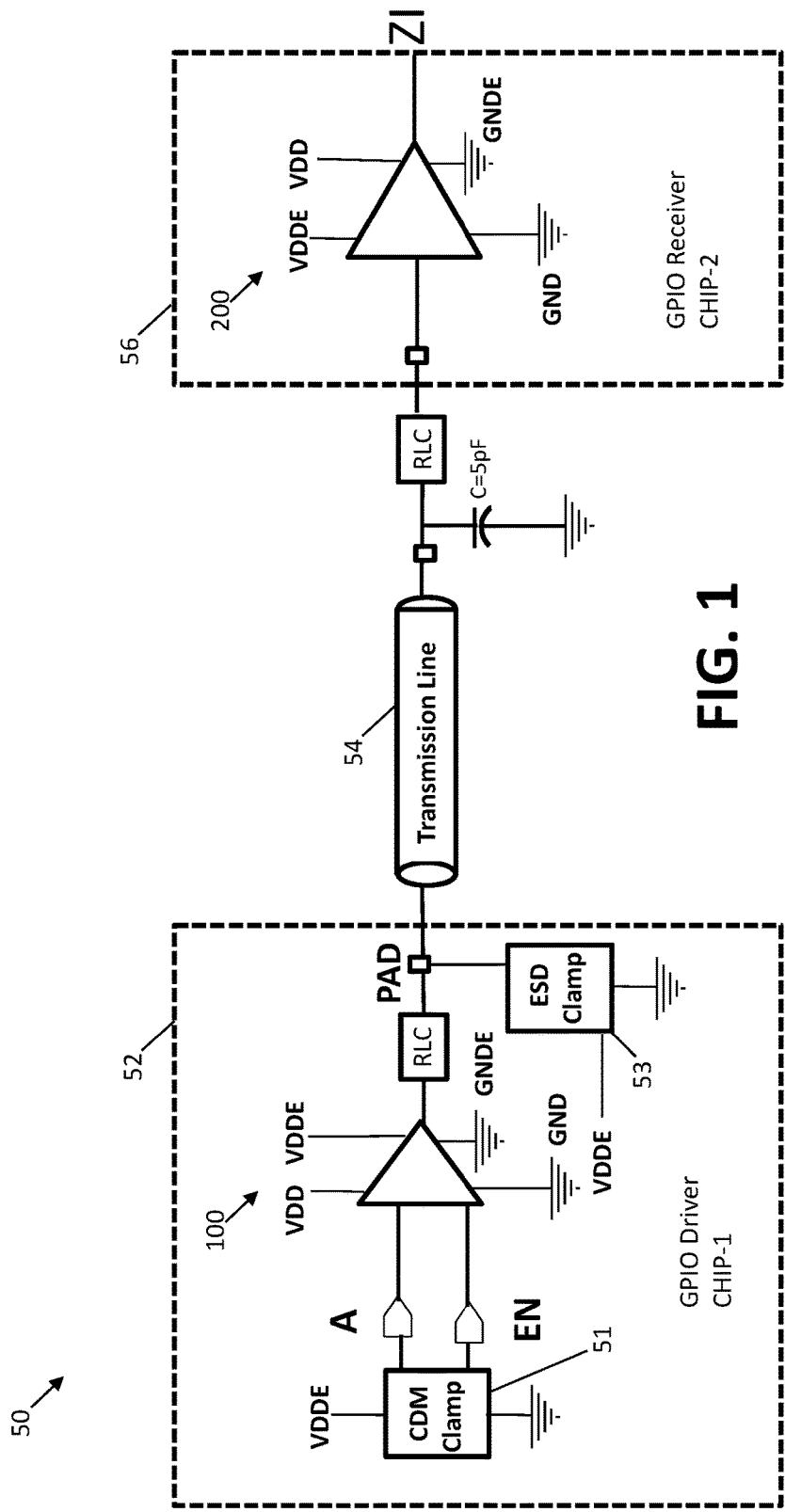
FIG. 1 is a block diagram of a communications system including a GPIO driver, GPIO receiver, and a transmission line coupling the two.

With reference to FIG. 1, a communications system 50 is now described. The communications system 50 includes first and second chips 52 and 56 communicating with one another via transmission line 54. The first chip 52 includes a GPIO driver 100, and the second chip 56 includes a GPIO receiver 200. This disclosure focuses on the GPIO driver 100, details of which will be given in detail below. Of note here is that a first Charge Device Model (CDM) clamp 51 is coupled to the data input A and enable input EN of the GPIO driver 100 to ward against CDM events, and a second Electrostatic Discharge (ESD) clamp 53 is coupled to output PAD to ward against ESD events. When the logic value at the enable input EN indicates that the GPIO driver 100 is to be enabled, the GPIO driver 100 serves to shift the level of logic signal at the data input A and output it to the output PAD to therefore be transmitted to the GPIO receiver 200 over the transmission line 54.

Figure 2:
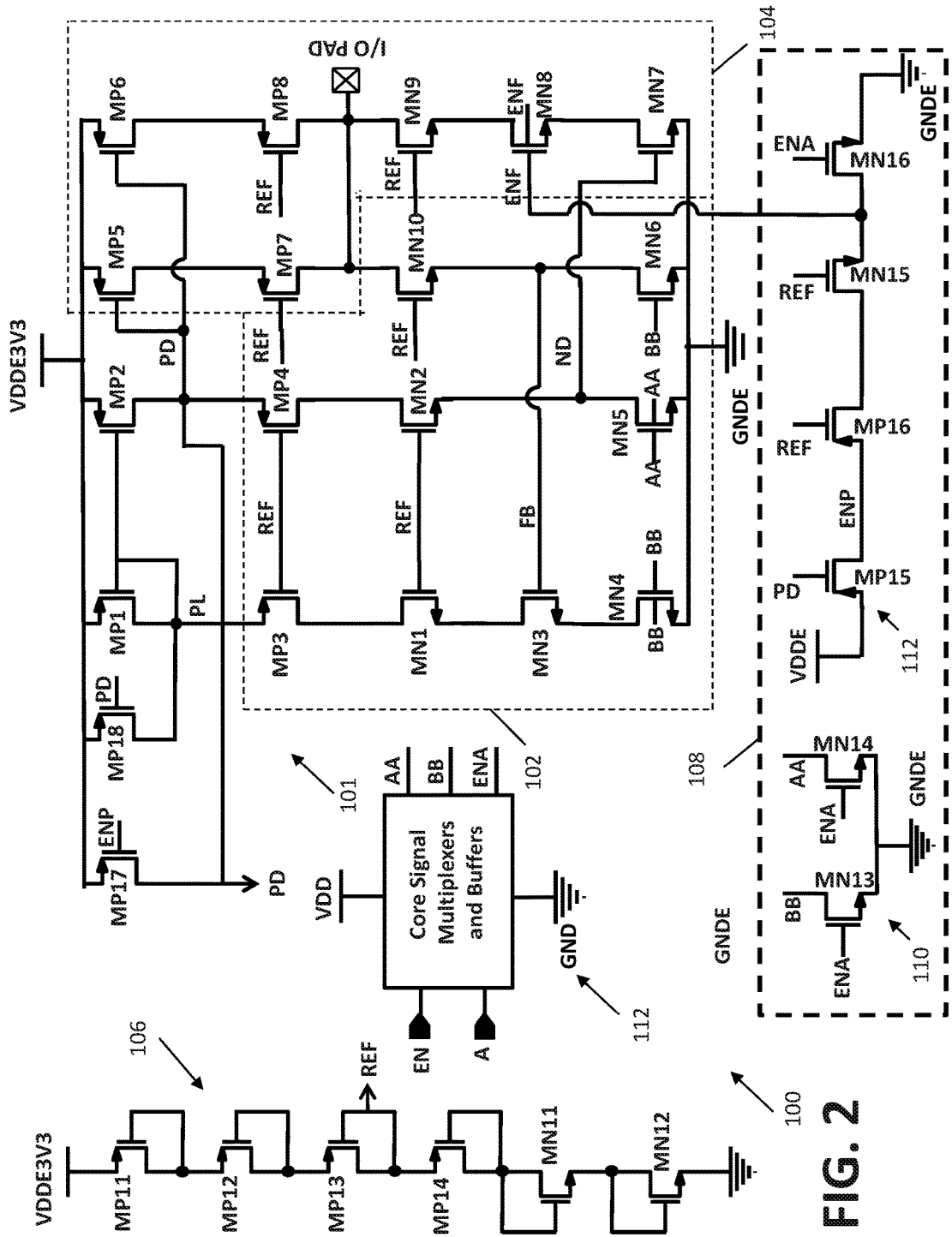
FIG. 2 is a circuit schematic diagram of the GPIO driver of FIG. 1, in accordance with this disclosure.
Figure 3:
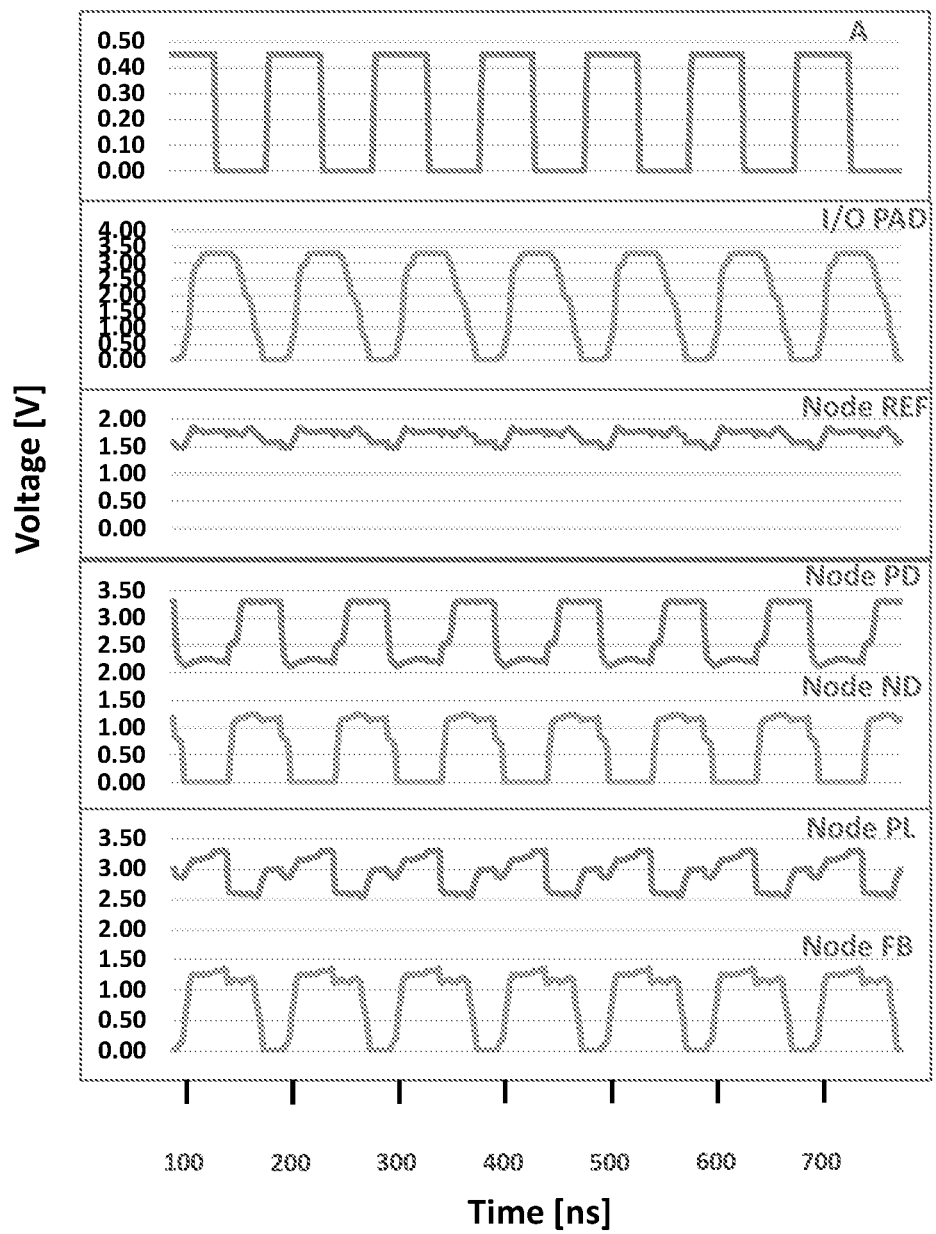
FIG. 3 is a timing diagram showing operation of the circuit schematic diagram of FIG. 2.

The GPIO driver 100 and its operation will now be described in detail with reference to FIGS. 2-3. The GPIO driver 100 includes a core logic circuit 112, a reference voltage generator circuit 106, an enable circuit 108, and a level shifting circuit 101.

The core logic circuit 112 receives as input a data input signal A and an enable signal EN, and outputs an input signal AA having a same logic level as the data input signal A, an input signal BB having a logic level that is a complement of that of the data input signal A, and an enable signal ENA having a logic level that is the same as that of the enable signal EN.

Of note is that the core logic circuit 112 is powered by a supply node VDD at a low supply voltage (for example, 0.45 V) and referenced to ground GLAD. The reference voltage generator 106, however, is powered by a supply node VDDE at a high supply voltage (for example, 3.3 V) and referenced to ground GLADE. A first part 110 of the enable circuit 108 receives signals AA and BB and is referenced to ground GLADE. A second part 112 of enable circuit 108 is reference to ground GLADE, and powered from VDDE. The level shifting circuit 101 is necessarily powered by supply node VDDE and referenced to ground GLADE. Ground GLAD and ground GLADE are not necessarily common.

The reference voltage generator circuit 106 includes, coupled between the supply node VDDE and ground GLADE. Four diode-connected PMOS transistors MP11, MP12, MP13, and MP14 coupled in series with one another and two diode-connected NMOS transistors MN11 and MN12 coupled in series. In greater detail, the source of MP11 is coupled to supply node VDDE, the drain of MP11 is coupled to the source of MP12, and the gate of MP11 is coupled to the drain of MP11. The source of MP12 is coupled to the drain of MP11, the drain of MP12 is coupled to the source of MP13, and the gate of MP12 is coupled to the drain of MP12. The source of MP13 is coupled to the drain of MP12, the drain of MP13 is coupled to the source of MP14, and the gate of MP13 is coupled to the drain of MP13. The source of MP14 is coupled to the drain of MP13, the drain of MP14 is coupled to the drain of MN11, and the gate of MP14 is coupled to the drain of MP14. The drain of MN11 is coupled to the drain of MP14, the source of MN11 is coupled to the drain of MN12, and the gate of MN11 is coupled to the drain of MN11. The drain of MN12 is coupled to the source of MN11, the source of MN12 is coupled to the ground node GLADE, and the drain of MN12 is coupled to the drain of MN12. The reference voltage generator circuit 106 operates to generate a reference voltage at node REF between the drain of MP13 and source of MP14 that is a fraction of VDDE. For example, with VDDE=3.3 V, the reference voltage at node REF is generated at 1.65 V. The voltage REF is sufficient to turn on the transistors to which it is coupled, but insufficient to cause overstress voltages across said transistors. Indeed, the usage of REF serves to limit voltage drops across the transistors so connected to approximately 2 V.

The first part 110 of enable circuit 108 includes NMOS transistor MN13 having its drain coupled to receive the input signal BB, its source coupled to the ground node GLADE, and its gate coupled to receive the enable signal ENA. The first part 110 of enable circuit 108 also includes NMOS transistor MN14 having its drain coupled to receive the input signal AA, its source coupled to the ground node GLADE, and its gate coupled to receive enable signal ENA.

The second part 112 of enable circuit 108 includes two PMOS transistors MP15 and MP16 coupled in series with one another and with two NMOS transistors MN15 and MN16 between the supply node VDDE and the ground node GLADE. In greater detail, the source of MP15 is coupled to VDDE, the drain of MP15 is coupled to the source of MP16, and the gate of MP16 is coupled to the first control node PD (which will be explained below). The source of MP16 is coupled to the drain of MP15, the drain of MP16 is coupled to the drain of MN15, and the gate of MP16 is coupled to the reference voltage REF. The drain of MN15 is coupled to the drain of MP16, the source of MN15 is coupled to the drain of MN16, and the gate of MN15 is also coupled to the reference voltage REF. The drain of MN16 is coupled to the source of MN15, the source of MN16 is coupled to the ground node GLADE, and the gate of MN16 is coupled to receive enable signal ENA. The enable circuit 108 serves to generate a control signal at a first enable node ENF between the source of MN15 and the drain of MN16, and serves to generate a control signal at a second enable node ENP between the drain of MP15 and source of MP16.

The level shifter 101 is now described. The level shifter 101 includes PMOS transistor MP17 having its source coupled to the supply node VDDE, its drain coupled to first control node PD, and its gate coupled to the second enable node ENP. PMOS transistor MP18 has its source coupled to the supply node VDDE, its drain coupled to the third control node PL, and its gate coupled to the control node PD.

PMOS transistor MP1 has its source coupled to the supply node VDDE, its drain coupled to the third control node PL, and its gate also coupled to the third control node PL. PMOS transistor MP2 has its source coupled to the supply node VDDE, its drain coupled to the first control node PD, and its gate coupled to the third control node PL. PMOS transistor MP3 has its source coupled to the third control node PL, its drain coupled to the drain of NMOS transistor MN1, and its gate coupled to the reference voltage REF. PMOS transistor MP4 has its source coupled to the first control node PD, its drain coupled to the drain of NMOS transistor MN2, and its gate coupled to the reference voltage REF.

PMOS transistor MP5 has its source coupled to the supply voltage VDDE, its drain coupled to the source of PMOS transistor MP7, and its gate coupled to the first control node PD. PMOS transistor MP6 has its source coupled to the supply voltage VDDE, its drain coupled to the source of PMOS transistor MP8, and its gate coupled to the first control node PD. PMOS transistor MP7 has its source coupled to the drain of PMOS transistor MP5, its drain coupled to the drain of NMOS transistor MN10 and I/O Pad, and its gate coupled to REF. PMOS transistor MP8 has its source coupled to the drain of PMOS transistor MP6, its drain coupled to the output I/O PAD, and its gate coupled to the reference voltage REF.

NMOS transistor MN1 has its drain coupled to the drain of PMOS transistor MP3, its source coupled to the drain of NMOS transistor MN3, and its gate coupled to REF. NMOS transistor MN2 has its drain coupled to the drain of PMOS transistor MP4, its source coupled to the second control node ND, and its gate coupled to reference voltage REF. NMOS transistor MN3 has its drain coupled to the source of NMOS transistor MN1, its source coupled to the drain of NMOS transistor MN4, and its gate coupled to the feedback node FB. NMOS transistor MN4 has its drain coupled to the source of NMOS transistor MN3, its source coupled to the ground node GLADE, and its gate coupled to receive the input signal complement BB. The bulk of MN4 is also coupled to the input signal complement BB. NMOS transistor NM5 has its drain coupled to the source of NMOS transistor MN2, its source coupled to the ground node GLADE, and its gate coupled to receive the input signal AA. The bulk of MN5 is also coupled to receive the input signal AA.

NMOS transistor MN6 has its drain coupled to the feedback node FB, its source coupled to the ground node GNDE, and its gate coupled to receive the input signal complement BB. NMOS transistor MN7 has its drain coupled to the source of NMOS transistor MN8, its source coupled to the ground node GNDE, and its gate coupled to the second control node ND. NMOS transistor MN8 has its drain coupled to the source of NMOS transistor MN9, its source coupled to the drain of NMOS transistor MN8, and its gate coupled to the enable node ENF. The bulk of MN8 is also coupled to enable node ENF.

NMOS transistor MN9 has its drain coupled to the output I/O PAD, its source coupled to the drain of NMOS transistor MN8, and its gate coupled to the reference voltage REF. NMOS transistor MN10 has its drain coupled to the output I/O PAD, its source coupled to the feedback node FB, and its gate coupled to the reference voltage REF.

Operation of the enable circuit 108 and level shifter 101 proceeds as follows. When the enable signal EN is low (indicating that the GPIO driver 100 is to be enabled) and data input A is high, enable signal ENA is generated as low, AA is generated as high, and BB is generated as low. ENA being low turns off MN13, MN14 which removes the clamp of node AA and BB to GNDE, and turns off MN16 which permits ENF to be not ground, and permits ENP to increase. MN16 being off results in the sourcing of current to node ENP, which serves to drive node ENP high, turning off MP17.

The reference voltage REF is sufficient to turn on MP3, MN1, MP7, MN10, MP8, MN9, MP16, and MN15. AA being high will turn on MN5, which then sinks current from the second control node ND, and, through MP4 and MN2, from the first control node PD. This pulls the second control node ND low, turning off MN7. This also pulls the first control node PD low, turning on MP5, MP6, MP15, and MP18. This causes MP18 to source current to the third control node PL, turning MP1 and MP2 off.

BB being low serves to turn off MN4 and MN6, and PD being low serves to cause MP5 and MP6 to source current, through MP7 and MP8, and into the output I/O PAD. Since MN6 and MN7 are off, the output I/O PAD is driven high, thereby matching the logic high state of the input A. Since input A is at 0.45 V and the output I/O PAD is at 3.3 V when driven high, the level shifter 101 has thus performed a logic level shift.

The static current consumption in this mode where I/O PAD is driven high is low, for example being less than 10 nA, or even less than 7 nA.

The voltages at the various nodes, inputs, and the output I/O pad, once the level shifter 101 reaches a steady state in the mode described above are as follows:

A=0.45 V; I/O PAD=3.3 V; AA=0.45 V; BB=0 V; FB=1.25 V; ND=0 V; PD=2.1 V; PL=3.2 V; ENA=0 V; ENP=3.3 V; and REF=1.65 V.

Where the enable signal EN is low (indicating that the GPIO driver 100 is to be enabled) and data input A transitions low, enable signal ENA is generated as low, AA is generated as low, and BB is generated as high. ENA being low turns off MN13, MN14, and MN16. MN16 being off results in the sourcing of current to node ENP, which serves to drive node ENP high, turning off MP17.

The voltage at node REF is sufficient to turn on MP3, MN1, MP7, MN10, MP8, MN9, MP16, and MN15. BB being high will turn on MN4 and MN6. MN4 being on will sink current through MP3, MN1, and MN3 from the third control node PL, pulling PL low, and thus turning on MP1 and MP2. MP2 will then source current to the first control node PD, and since MN5 will be off due to AA being low, the first control node PD will be driven high.

PD being high results in MP5 and MP6 being turned off. MP2 will also source current through MP4 and MN2 to the second control node ND. Since MN5 will be off, this will cause the second control node ND to be driven high, which in turn will turn on MN7. Since MN6 will be on due to BB being high and MN7 has now been turned on, MN6 and MN7 will serve to sink current, through MN10 and MN9 and MN8, from output I/O PAD, thereby pulling the output I/O PAD low and matching the logic low state of input A.

The static current consumption in this mode where I/O PAD is driven low is low, for example being less than 10 nA, or even less than 7 nA.

The voltages at the various nodes, inputs, and the output I/O pad, once the level shifter 101 reaches a steady state in the mode described above are as follows:

A=0 V; I/O PAD=0 V; AA=0 V; BB=0.45 V; FB=0 V; ND=1.25 V; PD=3.3 V; PL=2.8 V; ENA=0 V; ENP=3.3 V; and REF=1.65 V.

Where the enable signal EN is high (indicating that the GPIO driver 100 is to be disabled), enable signal ENA is generated as high. This serves to turn on MN13 and MN14, pulling AA and BB low, regardless of the input signal A. ENA being high serves to turn on MN16, sinking current from node ENP through MP16 and MN 15, pulling node ENP low. Node ENP being low serves to turn on MP17, sourcing current to the first control node PD, causing MP18, MP5, and MP6 to remain off. AA and BB being low will turn off MN4, MN5, and MN6. MN5 being off will serves to allow node ND to float. MN16 will also sink current from node ENF, thereby turning off MN8.

Thus, in this disable mode, due to MP5, MP6, MN6, and MN8 being off, the output I/O PAD is thereby decoupled from the supply node VDDE as well as the ground node GLADE, and thereby floats in a high impedance state.

The voltages at the various nodes, inputs, and the output I/O pad, once the level shifter 101 reaches a steady state in the mode described above are as follows:

EN=0.45 V; I/O PAD=High Z; AA=0 V; BB=0 V; FB=High Z; ND=1.25 V; PD=3.3 V; PL=2.8 V; ENA=0.45 V; ENP=2.1 V; ENF=0V and REF=1.65 V.

Compared to prior art designs, the GPIO driver 100 has a variety of advantages. For example, six paths from VDDE to GLADE are utilized to perform the I/O functions, whereas known prior art circuits use as many as fifteen or greater paths. Since the static current consumption is a function of a number of such paths, the GPIO driver 100 described herein has greatly reduced current consumption than prior designs.

Due to the reduction in the number of such paths, as well as a reduction in the number of circuit stages, the area consumed by the circuitry of the GPIO driver 100 is as low as 800 um$^2$ for example, as opposed to 6000 um$^2$ or more as consumed by prior designs. In addition, the GPIO driver 100 is capable of operating with the supply voltage VDD being at 0.45 V without an increase in leakage current, as opposed to prior designs.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. An electronic device, comprising:
an output stage coupled between a supply node and a ground node, configured to drive an output, and controlled by first, second, and third control nodes, wherein the first, second, and third control nodes are not common to one another;
a current sinking circuit controlled by an input signal and configured to:
where the input signal transitions to a first logic level, sink current from the first and second control nodes, thereby causing decoupling of the output stage from the ground node and sourcing of current to the output by the output stage,
where the input signal transitions to a second logic level different than the first logic level, sink current from a third control node, thereby causing decoupling of the output stage from the supply node and sinking of current from the output by the output stage.

2. The electronic device of claim 1, wherein the output stage comprises:
a pull-up circuit comprising:
a first PMOS transistor having a source coupled to the supply node, a drain to be coupled to the output, and a gate coupled to the first control node; and
a second PMOS transistor having a source coupled to the supply node, a drain to be coupled to the output, and a gate coupled to the first control node;
wherein sinking of current from the first control node turns on the first and second PMOS transistors, thereby causing sourcing of current to the output by the first and second PMOS transistors.

3. The electronic device of claim 2, wherein the current sinking circuit comprises:
a first NMOS transistor having a drain coupled to the second control node, a source coupled to the ground node, and a gate controlled by the input signal;
a second NMOS transistor having a drain to be coupled to the output, a source coupled to the ground node, and a gate controlled by a complement of the input signal;
wherein the input signal being at the first logic level results in turning on of the first NMOS transistor and sinking of current from the first control node;
wherein the input signal being at the second logic level results in turning on of the second NMOS transistor and sinking of current from the output by the second NMOS transistor.

4. The electronic device of claim 3, wherein the output stage further comprises:
a third NMOS transistor having a drain to be coupled to the output, a source coupled to the ground node, and a gate coupled to the second control node;
wherein turning on of the first NMOS transistor also results in sinking of current from the second control node causing turning off of the third NMOS transistor and decoupling of the output from the ground node;
wherein the input signal being at the first logic level results in turning off of the second NMOS transistor and further decoupling of the output from the ground node;
wherein the turning one of the first NMOS transistor causes sinking of current from the second control node by the first NMOS transistor;
wherein the sinking of current from the second control node, thereby turning off of the first NMOS transistor and the turning on of the third NOMS transistor to sink current from output.

5. The electronic device of claim 4, wherein the current sinking circuit further comprises a fifth NMOS transistor having a source coupled to the ground node, a drain, and a gate controlled by the input signal; and further comprising:
a third PMOS transistor having a source coupled to the supply node, a drain coupled to the third control node, and a gate coupled to the first control node;
a fourth PMOS transistor having a source coupled to the supply node, a drain coupled to the third control node, and a gate coupled to the third control node; and
a fifth PMOS transistor having a source coupled to the supply node, a drain coupled to the first control node, and a gate coupled to the third control node;
wherein the input signal being at the second logic level results in turning on of the fifth NMOS transistor, in turn causing sinking of current from the third control node, which in turn causes turn on of the fifth PMOS transistor;

wherein the turning on of the fifth PMOS transistor results in sourcing of current to the first control node, thereby causing turnoff of the first and second PMOS transistors, in turn causing decoupling of the output from the supply node.

6. The electronic device of claim 4, wherein the output stage further comprises a fourth NMOS transistor having a drain to be coupled to the output, a source coupled to the drain of the third NMOS transistor, and a gate coupled to a first enable node.

7. The electronic device of claim 6, further comprising an enable circuit, the enable circuit comprising:
a first enable NMOS transistor having a source coupled to the ground node, a drain coupled to the first enable node, and a gate coupled to a first enable signal;
a second enable NMOS transistor having a source coupled to the first enable node, a drain, and a gate coupled to a reference node;
a first enable PMOS transistor having a drain coupled to the drain of the second enable NMOS transistor, a source coupled to a second enable node, and a gate coupled to the reference node;
a second enable PMOS transistor having a drain coupled to the second enable node, a source coupled to the source node, and a gate coupled to the first control node; and
a third enable PMOS transistor having a source coupled to the supply node, a drain coupled to the first control node, and a gate coupled to the second enable node;
wherein the first enable signal being at a second logic level results in turning off of the first enable NMOS transistor, thereby causing sourcing of current to the first enable node by the second enable NMOS transistor, first enable PMOS transistor, and second enable PMOS transistor;
wherein the sourcing of current to the first enable node results in turning on of the fourth NMOS transistor;
wherein the first enable signal being at a first logic level results in turning on of the first enable NMOS transistor, thereby causing sinking of current from the first enable node by the first enable NMOS transistor;
wherein the sinking of current from the first enable node results in turning off of the fourth transistor.

8. An electronic device, comprising:
an output stage having an output, wherein the output stage is coupled between a supply node and a ground node and operates based on signals at first, second, and third control nodes, wherein the first, second, and third control nodes are not common to one another;
a current sinking circuit controlled as a function of an input signal and configured to:
sink current from the first and second control nodes, thereby causing decoupling of the output stage from the ground node; and
sink current from a third control node, thereby causing decoupling of the output stage from the supply node and the sinking of current from the output by the output stage;
wherein the output stage generates an output signal as a function of whether the output stage is decoupled from the ground node or decoupled from the supply node.

9. The electronic device of claim 8, wherein the output stage comprises:
a first transistor having a first conduction terminal coupled to the supply node, a second conduction terminal coupled to the output, and a control terminal coupled to the first control node; and
a second transistor having a first conduction terminal coupled to the supply node, a second conduction terminal coupled to the output, and a control terminal coupled to the first control node.

10. The electronic device of claim 9, wherein the second conduction terminal of the first transistor is coupled to the output through a third transistor; and wherein the second conduction terminal of the second transistor is coupled to the output through a fourth transistor.

11. The electronic device of claim 10, wherein:
the third transistor has a first conduction terminal coupled to the second conduction terminal of the first transistor, a second conduction terminal coupled to the output, and a control terminal coupled to a reference node; and
the fourth transistor has a first conduction terminal coupled to the second conduction terminal of the second transistor, a second conduction terminal coupled to the output, and a control terminal coupled to the reference node.

12. The electronic device of claim 11, wherein the reference node is at a reference voltage sufficient to turn on the third and fourth transistors when applied to the control terminals thereof but insufficient to configure the third and fourth transistors to experience overstress voltages thereacross.

13. The electronic device of claim 9, wherein the output stage further comprises:
a fifth transistor having a first conduction terminal coupled to the output, a second conduction terminal coupled to the ground node, and a control terminal coupled to the second control node.

14. The electronic device of claim 13, wherein the first conduction terminal of the fifth transistor is coupled to the output through sixth and seventh transistors.

15. The electronic device of claim 14, wherein:
the sixth transistor has a first conduction terminal, a second conduction terminal coupled to the first conduction terminal of the fifth transistor, and a fourth control node coupled to an enable circuit;
the seventh transistor has a first conduction terminal coupled to the output, a second conduction terminal coupled to the first conduction terminal of the sixth transistor, and control terminal coupled to a reference node.

16. The electronic device of claim 15, wherein the enable circuit is configured to selectively sink current from the fourth control node as a function of a logic value of an enable signal.

17. The electronic device of claim 8, further comprising:
an eighth transistor having a first conduction terminal coupled to the supply node, a second conduction terminal coupled to the third control node, and a control terminal also coupled to the third control node;
a ninth transistor having a first conduction terminal coupled to the supply node, a second conduction terminal coupled to the first control node, and a control terminal coupled to the third control node; and
an additional transistor having a first conduction terminal coupled to the supply node, a second conduction terminal coupled to the third control node, and a control terminal coupled to the first control node.

18. The electronic device of claim 8, wherein the current sinking circuit comprises:
a tenth transistor having a first conduction terminal coupled to the second control node, a second conduction terminal coupled to the ground node, and a control terminal coupled to receive a signal representative of the input signal.

19. The electronic device of claim 18, further comprising:
an eleventh transistor having a first conduction terminal, a second conduction terminal coupled to the first conduction terminal of the tenth transistor, and a control terminal coupled to a reference node;
a twelfth transistor having a first conduction terminal coupled to the first control node, a second conduction terminal coupled to the first conduction terminal of the eleventh transistor, and a control terminal coupled to the reference node.

20. The electronic device of claim 18, wherein the current sinking circuit further comprises:
a thirteenth transistor having a first conduction terminal, a second conduction terminal coupled to the ground node, and a control terminal coupled to receive a signal representative of a complement of the input signal;
a fifteenth transistor having a first conduction terminal, a second conduction terminal coupled to the ground node, and a control terminal coupled to receive a signal representative of a complement of the input signal;
a sixteenth transistor having a first conduction terminal, a second conduction terminal coupled to the first conduction terminal of the fifteenth transistor, and a control terminal coupled to the first conduction terminal of the thirteenth transistor.

21. The electronic device of claim 20, wherein the current sinking circuit further comprises:
a fourteenth transistor having a first conduction terminal, a second conduction terminal coupled to the first conduction terminal of the thirteenth transistor, and a control terminal coupled to a reference node;
a seventeenth transistor having a first conduction terminal, a second conduction terminal coupled to the first conduction terminal of theسsixteenth transistor, and a control terminal coupled to the reference node;
an eighteenth transistor having a first conduction terminal coupled to the third control node, a second conduction terminal coupled to the first conduction terminal of the seventeenth transistor, and a control terminal coupled to the reference node.

22. The electronic device of claim 8, further comprising an enable circuit configured to:
source current to the first control node, thereby causing decoupling of the output stage from the supply node; and
sink current from a fourth node, thereby causing decoupling of the output stage from the ground node.

23. The electronic device of claim 8, wherein the first and second control nodes are coupled.

* * * * *

UNITED STATES PATENT AND TRADEMARK OFFICE
CERTIFICATE OF CORRECTION

PATENT NO.         : 9,941,885 B2
APPLICATION NO.    : 15/257693
DATED              : April 10, 2018
INVENTOR(S)        : Singh Page 1 of 1

It is certified that error appears in the above-identified patent and that said Letters Patent is hereby corrected as shown below:

In the Specification
At Column 3, Line 62, please replace the term [[GLAD]] with -- GND --.
At Column 3, Line 65, please replace the term [[GLADE]] with -- GNDE --.
At Column 3, Line 67, please replace the term [[GLADE]] with -- GNDE --.
At Column 4, Line 1, please replace the term [[GLADE]] with -- GNDE --.
At Column 4, Line 3, please replace the term [[GLADE]] with -- GNDE -- and the term [[GLAD]] with -- GND --.
At Column 4, Line 4, please replace the term [[GLADE]] with -- GNDE --.
At Column 4, Line number 7, please replace the term [[GLADE]] with -- GNDE --.
At Column 4, Line number 26, please replace the term [[GLADE]] with -- GNDE --.
At Column 4, Line number 39, please replace the term [[GLADE]] with -- GNDE --.
At Column 4, Line number 43, please replace the term [[GLADE]] with -- GNDE --.
At Column 4, Line number 49, please replace the term [[GLADE]] with -- GNDE --.
At Column 4, Line number 60, please replace the term [[GLADE]] with -- GNDE --.
At Column 5, Line number 43, please replace the term [[GLADE]] with -- GNDE --.
At Column 5, Line number 48, please replace the term [[GLADE]] with -- GNDE --.
At Column 7, Line number 19, please replace the term [[GLADE]] with -- GNDE --.
At Column 7, Line number 28, please replace the term [[GLADE]] with -- GNDE --.

Signed and Sealed this
Seventeenth Day of July, 2018

Andrei Iancu
*Director of the United States Patent and Trademark Office*